US008993943B2

(12) United States Patent
Pohl et al.

(10) Patent No.: US 8,993,943 B2
(45) Date of Patent: Mar. 31, 2015

(54) SYSTEMS FOR OPERATING MULTIPLE PLASMA AND/OR INDUCTION HEATING SYSTEMS AND RELATED METHODS

(75) Inventors: Thomas Pohl, Ebringen (DE); Ulrich Heller, Niederrimsingen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 653 days.

(21) Appl. No.: 13/276,697

(22) Filed: Oct. 19, 2011

(65) Prior Publication Data

US 2012/0097666 A1 Apr. 26, 2012

(30) Foreign Application Priority Data

Oct. 20, 2010 (DE) ........................ 10 2010 048 810

(51) Int. Cl.

*H05B 6/06* (2006.01)
*B23K 9/00* (2006.01)
*B23K 9/02* (2006.01)
*G01R 31/00* (2006.01)
*G06F 15/18* (2006.01)
*H05H 1/46* (2006.01)

(52) U.S. Cl.

CPC .......... *H05B 6/06* (2013.01); *H05H 2001/4682* (2013.01)
USPC ........... 219/663; 219/121.54; 702/59; 706/12

(58) Field of Classification Search

CPC .......................... H05B 6/06; H05H 2001/4682
USPC ........ 219/121.36–121.59, 660–671; 700/287, 700/9; 706/12; 702/59
See application file for complete search history.

(56) References Cited

U.S. PATENT DOCUMENTS

| | | | |
|---|---|---|---|
| 4,189,765 | A | 2/1980 | Kotalik et al. |
| 4,283,723 | A | 8/1981 | Bickley et al. |
| 4,570,217 | A | 2/1986 | Allen et al. |
| 4,649,499 | A | 3/1987 | Sutton et al. |
| 4,679,137 | A | 7/1987 | Lane et al. |
| 4,755,811 | A | 7/1988 | Slavin et al. |
| 4,763,356 | A | 8/1988 | Day et al. |
| 4,766,425 | A | 8/1988 | Tallman et al. |
| 4,805,089 | A | 2/1989 | Lane et al. |
| 4,821,030 | A | 4/1989 | Batson et al. |
| 4,843,538 | A | 6/1989 | Lane et al. |
| 4,847,785 | A | 7/1989 | Stephens |
| 4,873,623 | A | 10/1989 | Lane et al. |

(Continued)

FOREIGN PATENT DOCUMENTS

| | | | |
|---|---|---|---|
| DE | 10148029 | A1 | 4/2003 |
| DE | 10326493 | A1 | 1/2005 |

(Continued)

*Primary Examiner* — Dana Ross
*Assistant Examiner* — Gyounghyun Bae
(74) *Attorney, Agent, or Firm* — Fish & Richardson P.C.

(57) ABSTRACT

In some aspects of the invention, a system for operating a plurality of plasma and/or induction heating processing systems includes an operating unit that has a display device on which a graphic user interface can be displayed, at least two power generators that supply power to a plasma process or an induction heating process, and a network that connects the operating unit to the power generators to transmit signals between the operating unit and the power generators. The graphic user interface includes a static region and a dynamic region, and a selection device for selecting information to be displayed in the dynamic region.

19 Claims, 6 Drawing Sheets

(56) References Cited

U.S. PATENT DOCUMENTS 4,914,624 A 4/1990 Dunthorn
4,951,190 A 8/1990 Lane et al.
4,967,381 A 10/1990 Lane et al.
5,025,411 A 6/1991 Tallman et al.
5,081,332 A 1/1992 Sakuragawa
5,159,673 A 10/1992 Sackmann et al.
5,230,063 A 7/1993 Hoeber et al.
5,243,697 A 9/1993 Hoeber et al.
5,257,349 A 10/1993 Alexander
5,301,348 A 4/1994 Jaaskelainen
5,325,481 A 6/1994 Hunt
5,404,458 A 4/1995 Zetts
5,406,307 A 4/1995 Hirayama et al.
5,479,602 A 12/1995 Baecker et al.
5,495,566 A 2/1996 Kwatinetz
5,550,969 A 8/1996 Torres et al.
5,586,237 A 12/1996 Baecker et al.
5,596,738 A 1/1997 Pope
5,644,334 A 7/1997 Jones et al.
5,664,133 A 9/1997 Malamud et al.
5,727,174 A 3/1998 Aparicio et al.
5,745,718 A 4/1998 Cline et al.
5,805,442 A 9/1998 Crater et al.
5,842,020 A * 11/1998 Faustini ........................ 717/111
5,874,807 A 2/1999 Neger et al.
5,874,948 A 2/1999 Shieh
5,892,440 A 4/1999 Bryan
5,909,192 A 6/1999 Finch et al.
5,971,591 A * 10/1999 Vona et al. .................... 700/220
5,975,737 A 11/1999 Crater et al.
5,978,742 A 11/1999 Pickerd
5,999,163 A 12/1999 Ivers et al.
6,002,398 A 12/1999 Wilson
6,061,603 A 5/2000 Papadopoulos et al.
6,139,177 A 10/2000 Venkatraman et al.
6,151,625 A 11/2000 Swales et al.
6,177,933 B1 1/2001 Young
6,208,340 B1 3/2001 Amin et al.
6,222,521 B1 4/2001 Ivers et al.
6,229,536 B1 5/2001 Alexander et al.
6,275,987 B1 8/2001 Fraley et al.
6,282,454 B1 8/2001 Papadopoulos et al.
6,298,377 B1 10/2001 Hartikainen et al.
6,311,101 B1 10/2001 Kastner
6,331,867 B1 12/2001 Eberhard et al.
6,335,725 B1 1/2002 Koh et al.
6,337,699 B1 1/2002 Nielsen
6,359,634 B1 3/2002 Cragun et al.
6,433,801 B1 8/2002 Moon et al.
6,434,157 B1 8/2002 Dube et al.
6,484,061 B2 11/2002 Papadopoulos et al.
6,493,661 B1 12/2002 White et al.
6,496,209 B2 12/2002 Horii
6,502,234 B1 12/2002 Gauthier et al.
6,559,868 B2 5/2003 Alexander et al.
6,564,375 B1 5/2003 Jiang
6,574,791 B1 6/2003 Gauthier et al.
6,580,442 B1 6/2003 Singh et al.
6,584,559 B1 6/2003 Huh et al.
6,587,884 B1 7/2003 Papadopoulos et al.
6,618,692 B2 9/2003 Takahashi et al.
6,628,311 B1 9/2003 Fang
6,691,064 B2 2/2004 Vroman
6,728,262 B1 4/2004 Woram
6,732,191 B1 5/2004 Baker et al.
6,760,782 B1 7/2004 Swales
6,766,210 B2 7/2004 Jun et al.
6,772,033 B2 8/2004 Scherer et al.
6,778,921 B2 8/2004 Keane et al.
6,785,730 B1 8/2004 Taylor
6,791,545 B2 9/2004 Miller et al.
6,795,798 B2 9/2004 Eryurek et al.
6,801,920 B1 10/2004 Wischinski
6,819,315 B2 11/2004 Toepke et al.
6,819,960 B1 11/2004 McKelvey et al.
6,832,118 B1 12/2004 Heberlein et al.
6,850,252 B1 * 2/2005 Hoffberg ...................... 715/716
6,854,055 B1 2/2005 Stinus et al.
6,857,105 B1 2/2005 Fox et al.
6,865,717 B2 3/2005 Wright
6,891,849 B1 5/2005 Jasperneite et al.
6,901,306 B2 5/2005 Nakamoto et al.
6,927,770 B2 8/2005 Ording
6,952,727 B1 10/2005 Lindner et al.
6,962,644 B2 11/2005 Paterson et al.
6,963,922 B2 11/2005 Papadopoulos et al.
6,993,404 B2 1/2006 Lev et al.
6,995,545 B2 2/2006 Tracy et al.
7,024,548 B1 4/2006 O Toole
7,035,768 B2 4/2006 Matsuda
7,035,898 B1 4/2006 Baker
7,058,693 B1 6/2006 Baker
7,061,926 B2 6/2006 Breinlinger
7,062,359 B2 * 6/2006 Bjorklund ..................... 700/286
7,082,576 B2 7/2006 Shahine et al.
7,085,841 B2 8/2006 Edwards et al.
7,089,414 B2 8/2006 Langford et al.
7,113,904 B2 9/2006 Litster et al.
7,119,797 B2 10/2006 Kawano et al.
7,120,917 B2 10/2006 Feist
7,124,239 B2 10/2006 Saito et al.
7,131,000 B2 10/2006 Bradee
7,133,921 B2 11/2006 Nasman et al.
7,137,074 B1 11/2006 Newton et al.
7,146,408 B1 12/2006 Crater et al.
7,146,541 B2 12/2006 Blumberg et al.
7,178,103 B2 2/2007 Humphrey et al.
7,184,906 B2 * 2/2007 Fender et al. ................... 702/67
7,197,634 B2 3/2007 Kruger et al.
7,203,560 B1 4/2007 Wylie et al.
7,219,306 B2 5/2007 Kodosky et al.
7,233,830 B1 6/2007 Callaghan et al.
7,245,293 B2 7/2007 Hoshino et al.
7,262,555 B2 8/2007 Rueger et al.
7,263,546 B1 8/2007 Kostadinov
7,266,589 B2 9/2007 Brownhill et al.
7,281,221 B2 10/2007 Zver et al.
7,285,916 B2 10/2007 Wi
7,290,030 B2 10/2007 Edwards
7,308,678 B2 12/2007 Allor
7,312,827 B2 12/2007 Cazier
7,345,679 B2 3/2008 Katayose
7,350,207 B2 3/2008 Fisher
7,356,774 B2 4/2008 Shah et al.
7,411,582 B2 8/2008 Toepke et al.
7,418,669 B2 8/2008 Melzer
7,421,531 B2 9/2008 Rotvold et al.
7,443,396 B2 10/2008 Ilic
7,467,018 B1 12/2008 Callaghan
7,475,358 B2 1/2009 Anzelde et al.
7,490,138 B2 2/2009 Crater et al.
7,493,337 B2 2/2009 Chaudhuri et al.
7,502,868 B2 3/2009 Genin et al.
7,536,538 B1 5/2009 Huang et al.
7,612,661 B1 11/2009 Johnson et al.
7,672,737 B2 3/2010 Hood et al.
7,681,055 B2 3/2010 Iijima
7,843,897 B2 * 11/2010 Casebolt et al. .............. 370/351
2002/0112038 A1 8/2002 Hessmer et al.
2002/0123864 A1 * 9/2002 Eryurek et al. ............... 702/188
2004/0039468 A1 2/2004 Zahorack et al.
2004/0111512 A1 6/2004 Barth
2004/0176868 A1 9/2004 Haga et al.
2004/0205111 A1 10/2004 Chasmawala et al.
2005/0103760 A1 * 5/2005 Kaplan et al. ............ 219/121.68
2005/0137845 A1 6/2005 Carroll et al.
2005/0182979 A1 * 8/2005 Gross et al. ................... 713/300
2005/0231348 A1 10/2005 Roth et al.
2006/0130047 A1 6/2006 Burugapalli
2006/0136829 A1 6/2006 Abbar et al.
2006/0184356 A1 8/2006 Kim et al.
2006/0242621 A1 10/2006 Ye et al.
2007/0018955 A1 1/2007 Blersch
2007/0150819 A1 6/2007 Goodman et al.

(56) References Cited

U.S. PATENT DOCUMENTS

| | | | | |
|---|---|---|---|---|
| 2007/0179675 | A1* | 8/2007 | Sukhanov et al. | 700/287 |
| 2007/0288125 | A1 | 12/2007 | Quaratiello | |
| 2008/0105538 | A1 | 5/2008 | Winterhalter et al. | |
| 2008/0158170 | A1 | 7/2008 | Herz et al. | |
| 2008/0168393 | A1 | 7/2008 | Rosskopt | |
| 2008/0183303 | A1 | 7/2008 | West | |
| 2008/0281850 | A1 | 11/2008 | Schoning | |
| 2009/0037013 | A1 | 2/2009 | Hendler et al. | |
| 2009/0064143 | A1 | 3/2009 | Bhogal et al. | |
| 2009/0089709 | A1 | 4/2009 | Baier et al. | |
| 2009/0094682 | A1 | 4/2009 | Sage et al. | |
| 2009/0119618 | A1 | 5/2009 | Norman et al. | |
| 2009/0119669 | A1 | 5/2009 | Norman et al. | |
| 2009/0143889 | A1* | 6/2009 | Brady et al. | 700/108 |
| 2010/0023174 | A1* | 1/2010 | Nagata et al. | 700/287 |
| 2010/0185336 | A1* | 7/2010 | Rovnyak et al. | 700/287 |

FOREIGN PATENT DOCUMENTS

| | | | |
|---|---|---|---|
| DE | 102006052061 | B4 | 4/2009 |
| EP | 0335139 | A2 | 10/1989 |
| EP | 0507470 | A2 | 10/1992 |
| EP | 1100231 | A1 | 5/2001 |
| EP | 1408395 | A2 | 4/2004 |
| EP | 1430379 | A2 | 6/2004 |
| EP | 1200884 | B1 | 8/2005 |
| EP | 1188293 | B1 | 10/2005 |
| EP | 1589793 | A1 | 10/2005 |
| EP | 0937289 | B1 | 3/2006 |
| EP | 1801946 | A1 | 6/2007 |
| EP | 1895374 | A2 | 3/2008 |
| EP | 1906288 | A2 | 4/2008 |
| EP | 2076784 | A2 | 7/2009 |
| GB | 2430774 | A | 4/2007 |
| JP | 9062446 | A | 3/1997 |
| JP | 2000092094 | A | 3/2000 |
| JP | 2008243136 | A | 10/2008 |
| JP | 2009187976 | A | 8/2009 |
| KR | 900006180 | B1 | 8/1990 |
| KR | 1020050100253 | A | 10/2005 |
| TW | 544624 | B | 8/2003 |
| WO | 0057281 | A1 | 9/2000 |
| WO | 03065192 | A1 | 8/2003 |
| WO | 2004084165 | A2 | 9/2004 |
| WO | 2006111573 | A1 | 10/2006 |
| WO | 2007045133 | A1 | 4/2007 |
| WO | 2008046695 | A1 | 4/2008 |
| WO | 2008061784 | A1 | 5/2008 |
| WO | 2008064763 | A1 | 6/2008 |
| WO | 2008090420 | A1 | 7/2008 |
| WO | 2009006149 | A1 | 1/2009 |

* cited by examiner

SYSTEMS FOR OPERATING MULTIPLE PLASMA AND/OR INDUCTION HEATING SYSTEMS AND RELATED METHODS

CROSS REFERENCE TO RELATED APPLICATION

This application claims priority under 35 U.S.C. §119(a) to German Application No. 10 2010 048 810.0, filed on Oct. 20, 2010, the entire contents of which are hereby incorporated by reference.

TECHNICAL FIELD

The invention relates to systems for operating multiple plasma and/or induction heating systems and related methods.

BACKGROUND

Plasma and/or induction heating processing systems are typically supplied with power by a power generator. Each power generator typically has an individual operating unit (e.g., an integrated panel) so that the power generator can be operated and the processing system that the power generator supplies with power can be controlled and influenced. However, this typically requires an operator to be in position at each respective power generator in order to carry out operations in the power generator and/or the process.

SUMMARY

In some aspects of the invention, a system for controlling a plurality of plasma and/or induction heating processing systems includes an operating unit, at least two power generators that each supply power to a plasma processing system or an induction heating processing system, and a network via which the operating unit is connected (e.g., connected by a hardwire connection or wirelessly) to the power generators in order to transmit signals. The operating unit has a display device, on which a graphic user interface can be displayed, that has a static region and a dynamic region, and a selection device for selecting the information to be displayed in the dynamic region.

Such a system can advantageously control multiple plasma processing systems and/or induction heating processing systems from a central location (i.e., from a central operating unit). Since the operating unit is typically connected to the power generators via a network, the operating unit can also be arranged remotely from the power generators. A data exchange between the power generators and the operating unit can be carried out via the network and the operating unit can transmit control commands to the power generators.

An additional advantage for the user can be achieved by dividing a graphic user interface of an operating unit into a static region and a dynamic region. The dynamic region can be configured in such a manner that the adjustment and/or monitoring for individual connected power generators can be displayed in the dynamic region, but also the adjustment and/or monitoring for multiple connected power generators can be displayed simultaneously. The selection as to whether information (e.g., values) from only one power generator or multiple power generators is displayed simultaneously in the dynamic region can be carried out via a selection device, such as corresponding tabs in the dynamic region or control elements in the static region. The user can thus typically select the adjustment in which the user can monitor or adjust the power generators of interest.

In complex industrial operations it can be advantageous for the user to monitor individual power generators or to directly observe the effects that adjustments of certain parameters have on other established values. Effects to a first power generator can also occur if an adjustment value is changed in a second power generator. Typically, events can arise that cause warning and/or error messages in the power generators or the processing systems that the power generators supply with power. It is typically important for the user to be able to recognize such events. If such warning or error messages are displayed in a static region that is separated from the dynamic region, established values and adjustment values can further be observed or changed in the dynamic region while the error and/or warning messages can be observed in the static region. In some cases, multiple established values and adjustment values can be displayed simultaneously for multiple power generators or system components, or only the established values and adjustment values for an individual power generator or system component can be displayed. A display region can be provided in the static region for displaying warning or error messages from all connected power generators and system components.

In some embodiments, at least two different types of power generators are provided. It is possible to control and to influence different power generator types with the same operating unit. The different types of power generators can be power generators of different power classes. The power generator types can also differ in terms of the frequency range of the output signal. Alternating current and direct current power generators can be provided. It is also possible to provide generators that are explicitly constructed and adapted for plasma applications and power generators that are constructed and adapted for induction heating applications. At least two power generators can simultaneously be controllable by the operating unit. The system can automatically detect all the power generators that are connected to the network. Alternatively, it is possible to carry out an adjustment in the operating unit so that only manually selected power generators can be controlled.

There can also be provision for each of the power generators to not have its own operating unit. For example, if the power generators are controlled by a single central operating unit, it is typically not necessary for the power generators to have its own operating unit. Production and development costs can thereby be reduced. However, it is possible for multiple power generators to have an individual operating unit (e.g., a standard panel) so that operations of the power generators can be carried out in one location. Operation via the central operating unit can be independent of the operation with a local operating unit arranged directly on the power generator.

The operating unit can include an input device for manipulating the graphic user interface. The input device can include a touchpad, a mouse, a keyboard, a Man Machine Interface (MMI) or similar device. Data can be input into the operating unit via the graphic user interface using the input device. Alternatively, parameters (e.g., operating parameters) for the controlled power generator can be changed via the graphic user interface using the input device. The advantages of using a central operating unit become apparent in this instance because a user typically only has to interact with a single graphic user interface as opposed to multiple graphic user interfaces that are each associated with an individual controlled power generator. The operation of a system with a plurality of power generators is thereby simplified substantially.

Additional controllable system components can be connected to the operating unit via the network. In addition to the power generators, the additional controllable system components can also be controlled and influenced by the single operating unit. Additional controllable system components can include, for example, impedance matching devices, machines, plasma chambers, and other similar devices.

Information relating to the power generators that are controlled by the operating unit or warning messages and/or statuses relating to the processing systems supplied with power by the power generators can be displayed on the display device. If warning messages are displayed, it is possible to react directly to the messages via the operating unit, and the power generator can be adjusted to a safe state. Alternatively, other measures can be taken in order to change the process that is supplied with power by the corresponding power generator back into a permissible region. It can also be advantageous if statuses of the processing systems or power generators are displayed. Consequently, the processing systems can be monitored in a timely manner.

An identifier can be associated with the power generators. An operating application that imports the identifier of power generators connected to the operating application and constructs the graphic user interface on the display device using generator-specific configuration data, and the identifier stored for the power generator can be implemented on the operating unit. An identifier can also be associated with the controllable system components and the component-specific configuration data.

It is possible to operate different controllable power generators and system components with only one operating unit. If the operating application, due to the identifier associated with the power generator, identifies which generator or component is intended to be operated, it is possible based on the identifier to use the correct configuration data for that specific generator or component in order to construct the graphic user interface. The graphic user interface is substantially the same for all the power generators. There are typically only slight adaptations to the generator. For example, the maximum adjustable power can be 1 kW in the case of a 1 kW generator. With another type of generator, such as a 3 kW generator, a maximum power of 3 kW can be adjusted accordingly. Power generators of various types can be generators that operate in various frequency ranges that have different nominal output power levels, that are used in a plasma application and/or an induction heating application, and that are alternating current generators or direct current generators. This listing of various types of power generator is not intended to be a conclusive listing.

The user interface has a static region. The static region can be arranged at one or more peripheral regions of the user interface on a display device, such as a video screen. It can be arranged at substantially the same location of the graphic user interface for all power generator types and system component types and have substantially the same dimensions in relation to the display device (i.e., the static region can always take up the same percentage surface-area of the user interface). The static region can display superordinate information and control elements that are provided identically for all the power generators or system components. Superordinate control elements can include an on/off switch, operating status selection (e.g., control/adjustment mode, diagnosis mode, software update), and/or language selection. Superordinate information can include type designation, identifier of the power generator, warnings, error statuses, operating status display, cooling water temperature, and/or connection status.

The user interface also has a dynamic region. The dynamic region can be arranged at one or more peripheral regions of the operating interface on a display device, such as a video screen. It can be arranged at the same location for substantially all power generator types and system component types and have the same dimensions with respect to the display device (i.e., the dynamic region can occupy the same percentage surface-area of the user interface). In the portion of the graphic user interface associated with the dynamic region, information relating to only one power generator can be displayed and the information relating to other power generators can be hidden. It is possible to provide tabs by which it is possible to select the power generator for which information is intended to be displayed. The dynamic region can have a predetermined grid in which values can be displayed and adjusted. Depending on the identifier of the power generator, the dynamic region can have a different number of displayed values and values to be adjusted. Views in the form of tabs can also be provided in the dynamic region for displaying various topics, such as, for example, initial variables, arc detection, or other properties of a power generator.

Comparable values (e.g., electric current, voltage, frequency, power, and other values) can be displayed at the same location in the case of different power generator types or provided for adjustment.

Control elements for changing between different views or information contents in the dynamic region may be provided in the static region of the operating interfaces. The different views or information contents can include information relating to diagnosis, monitoring, control, configuration and/or software updates. The selectable views or information contents provided can be the same for all power generator types.

The number of regions on the graphic user interface can be limited to a maximum of two (e.g., a static and a dynamic region) that are both always visible for the user. This improves clarity and consequently the user-friendliness.

The slight deviations can be related to the generator type, but they can also be dependent on the type of operating unit. For example, slight differences may be necessary if a touchscreen is used as an operating unit as an input device for the operating unit instead of a mouse or keyboard.

Regardless of the number and type of connected power generators and system components, the same proportion of the surface-area of the user interface can be associated with the dynamic region and the same proportion of the surface-area on the user interface can be associated with the static region. Furthermore, the same shape and arrangement on the graphic user interface or the display device can be provided for the regions mentioned.

The configuration data of a power generator can be stored in the power generator itself or in the operating unit. The configuration data can be stored in the generator and, after connection to an operating unit, be exported by it. Storing the configuration data in the generator has the advantage that new power generators that are not yet known to a relatively old operating unit can also be controlled by the operating unit. Alternatively, the configuration data can be stored directly in the operating unit. Storing the configuration data in the operating unit has the advantage that power generators that do not have the capacity for storing configuration data themselves can also be controlled by the operating unit. The configuration data can be stored in multiple configuration files. However, it is also possible to store all the configuration data of all the power generators in a single configuration file. The data that belong to a certain power generator type can be stored in the configuration file in an enclosed manner. Using the identifier, the operating unit or the operating application indicates the data of the configuration file that have to be accessed in order to operate a selected power generator.

The configuration data can include generator-specific parameter data and/or visualization data. The parameter data can describe all or at least some of the parameters known for the corresponding power generator. The visualization data can describe all the parameters to be visualized and the manner in which they are intended to be displayed on the graphic user interface. Only a sub-quantity of visualization data can also be described if there are static parameters that are uniform for each power generator and are also intended to be displayed uniformly, such as, for example, current, voltage and power. The data or data files can be provided in Extensible Markup Language (XML) or another description format. XML is a language for displaying hierarchically structured data in the form of text data.

Language data that can be processed by the operating application can be stored in the operating unit. The language data can be stored for various languages in various files. For example, there can be a file for each language. However, several languages can also be grouped in a file and combined together.

In order to be able to operate many different power generators with one operating unit, it is advantageous for the graphic user interface to be dynamically constructed. It is thereby also possible to operate newer power generators with a relatively old operating unit because the necessary information (i.e., the configuration data) can be stored on the power generator and the graphic user interface can be generated using these data.

Templates generated in the operating application can be stored in the operating unit. These templates can be defined in order to allow a more specific graphic user interface for visualizing data or parameters. Parameters can then be associated with the masks in the visualization file.

It is also advantageous if there are multiple operating units that substantially have the same graphic user interface. The intuitive operability of the power generators is thereby facilitated. Operating units can include, for example, personal computers, notebook computers, a panel that is separate from the power generator, or an integrated panel. This listing is not intended to be definitive. Other embodiments such as, for example, a touchpad or a Man Machine Interface (MMI) can also be provided.

In addition to the power generators, system components that can be controlled by the operating unit and that each have an identifier can be provided. Consequently, it is also possible to operate additional system components with the same operating unit as the power generators. As system components, it is possible to use, for example, impedance matching units, a plasma chamber, and/or other machine components.

In another aspect of the invention, a method for controlling multiple power generators that each supply a plasma processing system or induction heating processing system with power includes an operating unit being connected to the power generators via a network and controlling the power generators, and a graphic user interface having a static region and a dynamic region being displayed on a display device. The network can be, for example, an Ethernet network. Each of the power generators can control one or more processing systems that act independently of each other. It is thus possible to control completely different and separate processing systems with one operating unit. The operating unit is advantageously generally configured in such a manner so that it can operate and control each generator of a specific producer. This means that the operating unit is used both in many frequency ranges (e.g., DC, medium frequency (MF), and high frequency (HF)) and also for many application fields (e.g., plasma, including laser, induction). Due to that flexibility, plasma and induction heating processing systems can be simultaneously controlled and monitored with the same operating unit.

Control commands and/or parameters for the power generators can be input or changed via the input device of the operating unit. The control commands and/or parameters can be input for each power generator with the same input device at a single operating unit. The operating unit can be arranged non-centrally (i.e., it does not have to be located in the immediate vicinity of the power generators).

It is advantageous for the power generators to supply mutually independent processing systems with power. The power generators that supply mutually independent processing systems with power can be controlled by a common operating unit. Accordingly, the information relating to power generators or the warning messages and/or statuses relating to processing systems supplied thereby can be displayed on a display device of the operating unit. All the warning messages relating to all the power generators and processing systems that are controlled by the operating unit can consequently be displayed on the same display device. It can typically be ensured that warning messages are observed by a user in a timely manner. This would typically not be the case if warning messages were displayed locally in the power generators that are located remotely from each other.

There can further be an overview page for each generator or a single overview page for all generators that can be displayed on the display device. If an overview page is provided for each generator, it is possible to switch between the pages and to have the information relating to the individual generators displayed successively. If a common overview page is included, information relating to all the power generators and optionally other system components can be displayed simultaneously.

Furthermore, information relating to multiple power generators can be displayed on the display device. It is also possible that only particularly relevant information relating to the power generators is displayed simultaneously and that other pages exist that contain additional information and may optionally be accessed by a user.

In this context, it is advantageous if the operating unit switches between the power generators, automatically or controlled by a user, and only displays information relating to a selected power generator.

The control of at least one power generator by one operating unit can be carried out by importing an identifier of at least one power generator, selecting and/or importing generator-specific configuration data in accordance with the identifiers imported, and constructing a graphic user interface on a display device of the operating unit based on the configuration data by an operating application that is installed on the operating unit.

It is first possible to import an identifier of a power generator. Using the identifier, it is then possible to import generator-specific configuration data. Alternatively, it is possible to first load configuration data (e.g., for multiple generator types), subsequently to import an identifier and then to select the relevant configuration data for the power generator to be operated using the identifier. After the operating unit has been connected to the generator, the operating application can construct a graphic user interface using configuration data (e.g., parameters and/or visualization data). Subsequently, language data can be used in order to provide the language information.

The configuration data can include generator-specific parameter data and/or visualization data. The parameter data include all or at least some of the parameters known for the power generator. The visualization data determine the structure of the graphic user interface. The parameters to be displayed are associated with various display elements from which the operating application in the operating unit composes the graphic user interface. The operating unit can display static and dynamic contents. It is thus possible for a message region to be included in the static region because it is provided for each power generator. Conversely, operating information can be included in the dynamic region because it is produced from the visualization data and the parameter data in a generator-specific manner.

In some embodiments, language data can be read and information can be displayed on the display device in accordance with the language data. It is consequently possible to carry out adaptation to the specific user and the user's language knowledge.

As already mentioned above, it is typically advantageous for the graphic user interface to be constructed in a dynamic manner.

Templates that enable the graphic user interface to be adapted can be defined in the operating application. Visualization data can be associated with the templates.

For identical configuration data, it is possible to produce and display substantially identical graphic user interfaces in different operating units. Consequently, due to different operating units, such as operating units including a display, a mouse and a keyboard or operating units including a display with a touchpad, power generators can have substantially the same graphic user interface so that a user can operate the power generators, with little regard to the operating unit used, once the user has become familiar with only one operating unit.

Furthermore, the identifier and the configuration data of a controllable system component can be imported and taken into consideration when constructing the graphic user interface. The operating units can therefore also be used to operate and control other components of the power supply system such as, for example, an impedance matching unit. Separate operating units are typically unnecessary for those system components. A single operating unit can be used to operate a plurality of generators and other system components simultaneously.

The configuration data of a power generator can be stored in the power generator or the operating unit and can have a time stamp or a priority identification number. The operating application can decide based on the time stamp or the priority identification number whether the configuration data stored in the power generator or the operating unit should be used to construct the graphic user interface on the display device. In this manner, the most current configuration data can typically be used when constructing the graphic user interface.

With each power generator and also each controllable system component, there can be associated a software status and/or an integration status, which is interrogated by the operating application. The software status or integration status is taken into account when constructing the graphic user interface. A power generator type can differ by different software statuses. In addition to differing software statuses, statuses in the programmable logic (related to a complex programmable logic device (CPLD) and/or a field-programmable gate array (FPGA)) can also change. Furthermore, parameters stored in the device can change. These changes in the device can lead to different integration levels of the device type. For this reason, each generator typically has an integration level that describes the system status. This may be continuous numbering, which begins at one and increases with each software change of any component in the system. Numbering can start at one because zero can indicate an undefined status. The operating application, in addition to the identifier of the power generator, can also determine the integration level and construct the graphic user interface on the display device in accordance with the respective integration level. It is possible to proceed in a flexible manner in this instance. If the identifier of the operating application is known, but the integration level is not yet known, it is also possible to use an older integration level for constructing the graphic user interface.

The details of one or more embodiments of the invention are set forth in the accompanying drawings and the description below. Other aspects, features, and advantages of the invention will be apparent from the description and drawings, and from the claims.

DETAILED DESCRIPTION

Figure 1:
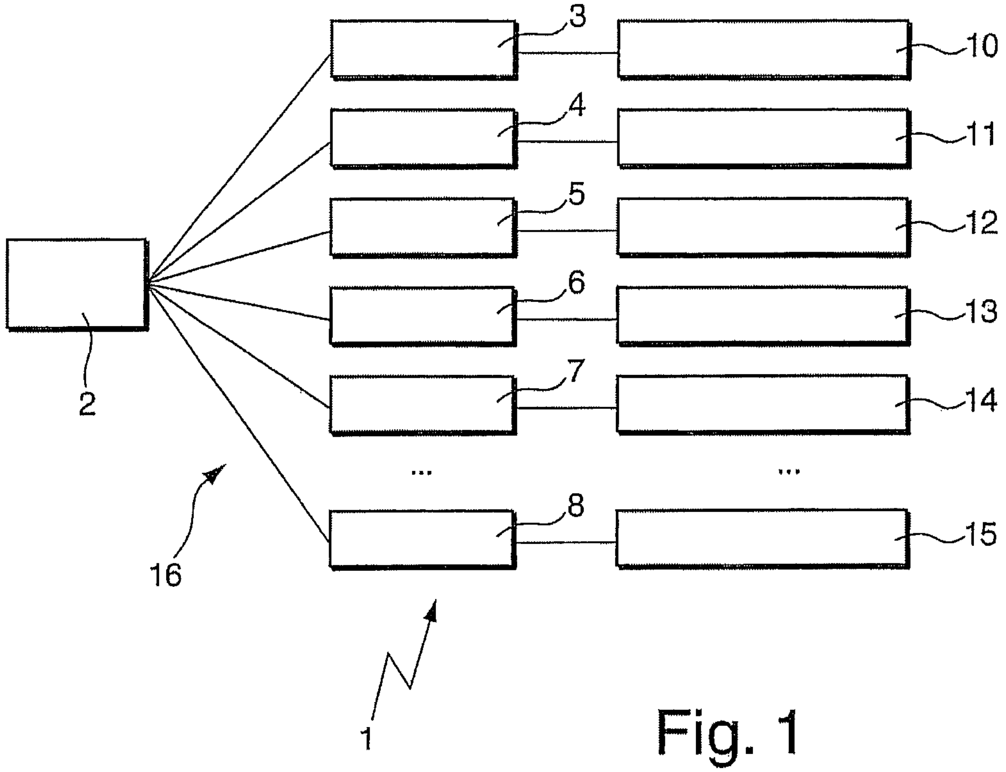
FIG. 1 is a schematic illustration of a system for controlling multiple plasma and/or induction heating processing systems.

FIG. 1 shows a system 1 for controlling multiple plasma and/or induction heating processing systems. Multiple power generators 3-8 are connected to a central operating unit 2 via a network 16. Each generator 3-8 supplies an individual processing system with power. For example, the generator 3 supplies power to a first induction heating processing system 10. The generator 4 supplies power to a first plasma processing system 11. The generator 5 supplies power to a second plasma processing system 12. The generator 6 supplies power to an induction heating processing system 13. The generator 7 supplies power to a plasma processing system (e.g., laser processing system) 14. The generator 8 supplies power to system 15, which can be any of various processing systems. The system 1 is shown below in detail in FIG. 8.

Figure 2:
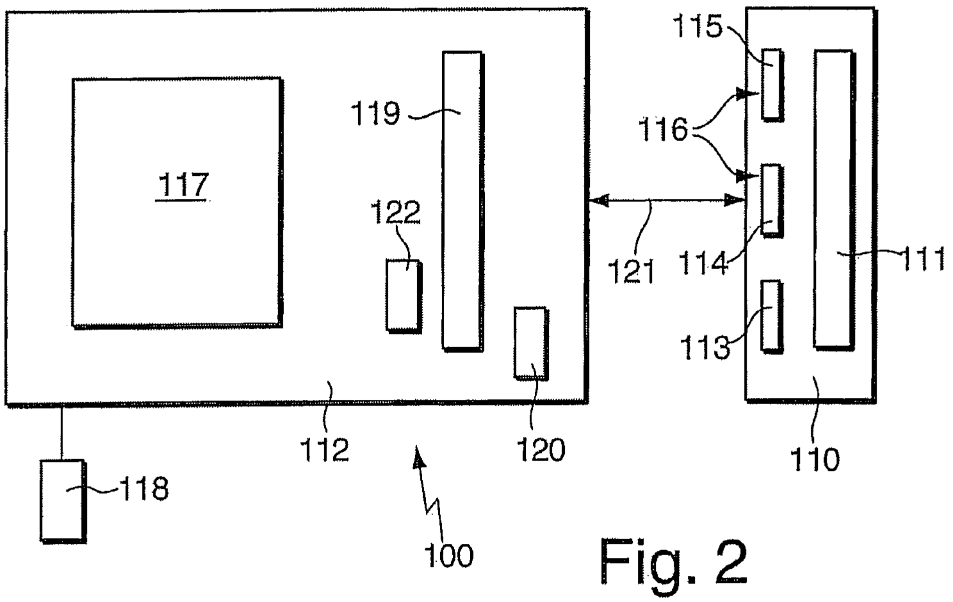
FIG. 2 is a schematic illustration of an operating unit and a power generator connected to the system shown in FIG. 1.

Referring to FIG. 2, a power supply system 100 includes an operating unit 112 and a power generator 110. A power generator application 111 that can be influenced by an operating unit 112 runs in the power generator 110. An identifier 113 is stored in the power generator 110. Parameter data 114 and visualization data 115 are also stored in the power generator 110. The parameter data 114 and visualization data 115 together constitute configuration data 116. The visualization data 115 and parameter data 114 can also be combined in one file.

The operating unit 112 includes a display device 117 and input device 118. The operating unit 112 imports the identifier 113 of the power generator 110. The operating unit 112 further imports the configuration data 116. Using the identifier 113 and the configuration data 116, a graphic user interface is constructed on the display device 117 by an operating application 119 using language data 120 which are stored in the operating unit 112. A user can input or change values using the input device 118 and the graphic user interface. Based on these inputs, the operating unit 112 can control the power generator 110. The operating unit 112 is connected (e.g., connected by a hardwire connection or wirelessly) to the power generator 110 in order to transmit signals via a network or a data connection 121 that is indicated by the double-headed arrow. Templates 122 can be produced on the operating unit 112, which allows a specific user-defined interface for visualizing generator-specific data. The operating unit 112 can also be connected to another type of power generator 110 or another controllable system component of the power supply system 100 in terms of data-processing and be used to control it.

Figure 3:
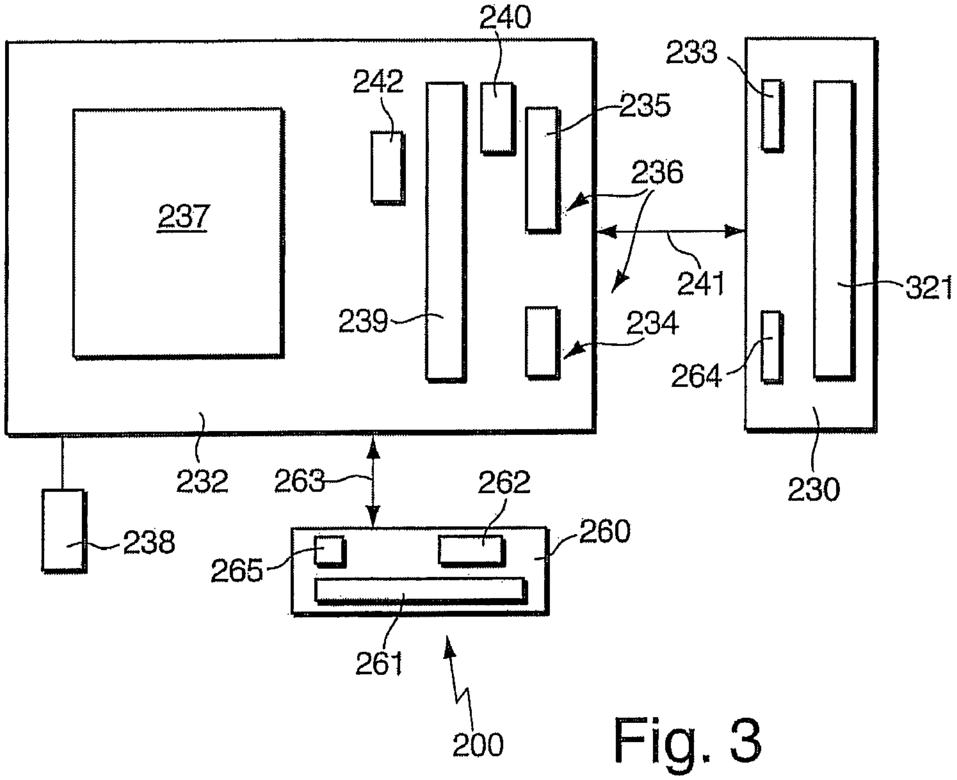
FIG. 3 is a schematic illustration an operating unit and a power generator connected to the system shown in FIG. 1.

FIG. 3 illustrates another example of a power supply system 200. The power supply system 200 includes a power generator 230 that has only one power generator application 231 and one identifier 233. Parameter data 234 and visualization data 235, which together form configuration data 236, are stored in an operating unit 232. The configuration data 236 can also include data of other power generators or controllable system components.

Using the identifier 233 that is imported by the operating unit 232, the appropriate configuration data for the power generator 230 can be selected. Using the configuration data 236 and language data 240, it is possible for an operating application 239 to construct a graphic user interface which is displayed on the display device 237. The graphic user interface 237 can be influenced by a user using the input device 238 (e.g., a touchpad, a mouse, or a keyboard). It is also possible to generate templates 242 in this instance.

The power generator 230 may be controlled via the operating unit 232 by a data connection 241.

Still referring to FIG. 3, the power supply system 200 includes a controllable system component 260 (e.g., an impedance matching unit). The system component 260 has a system component application 261 and an identifier 262. The identifier 262 can be imported from the operating unit 232 via the data connection 263. Configuration data 236 that belong to the system component 260 can be determined using the identifier 262. The graphic user interface displayed on the display device 237 can be modified in such a manner that the data relating to the system component 260 can also be manipulated. Consequently, the system component 260 can also be controlled by the operating unit 232. In addition to the identifier 232, the power generator 230 can also have an integration status 264 which can be imported from the operating unit 232. The system component 260 can also have an integration level 265 in addition to the identifier 262. It is thereby possible to select the configuration data 236 that best reflect the system status of the power generator 230 or the system component 260. The data connections 241 and 263 are an integral component of a network.

Figure 4:
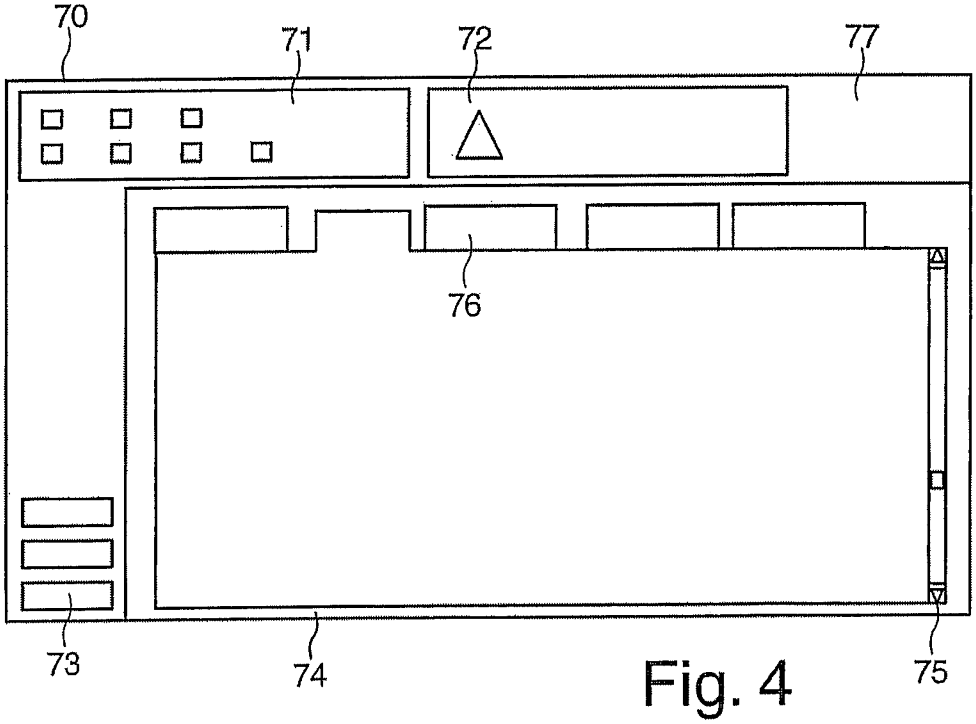
FIG. 4 shows an illustration of a graphic user interface.

The graphic user interface 70 shown in FIG. 4 has a static region 77 and a dynamic region 74. The dynamic region 74 includes multiple tabs 76, by which the user can select the desired display. The dynamic region 74 can include a scrolling bar 75. The static region 77 has primary information and control elements 73. Superordinate information to be displayed can be, for example, a status message region 71 and a warning and/or error message region 72.

Figure 5:
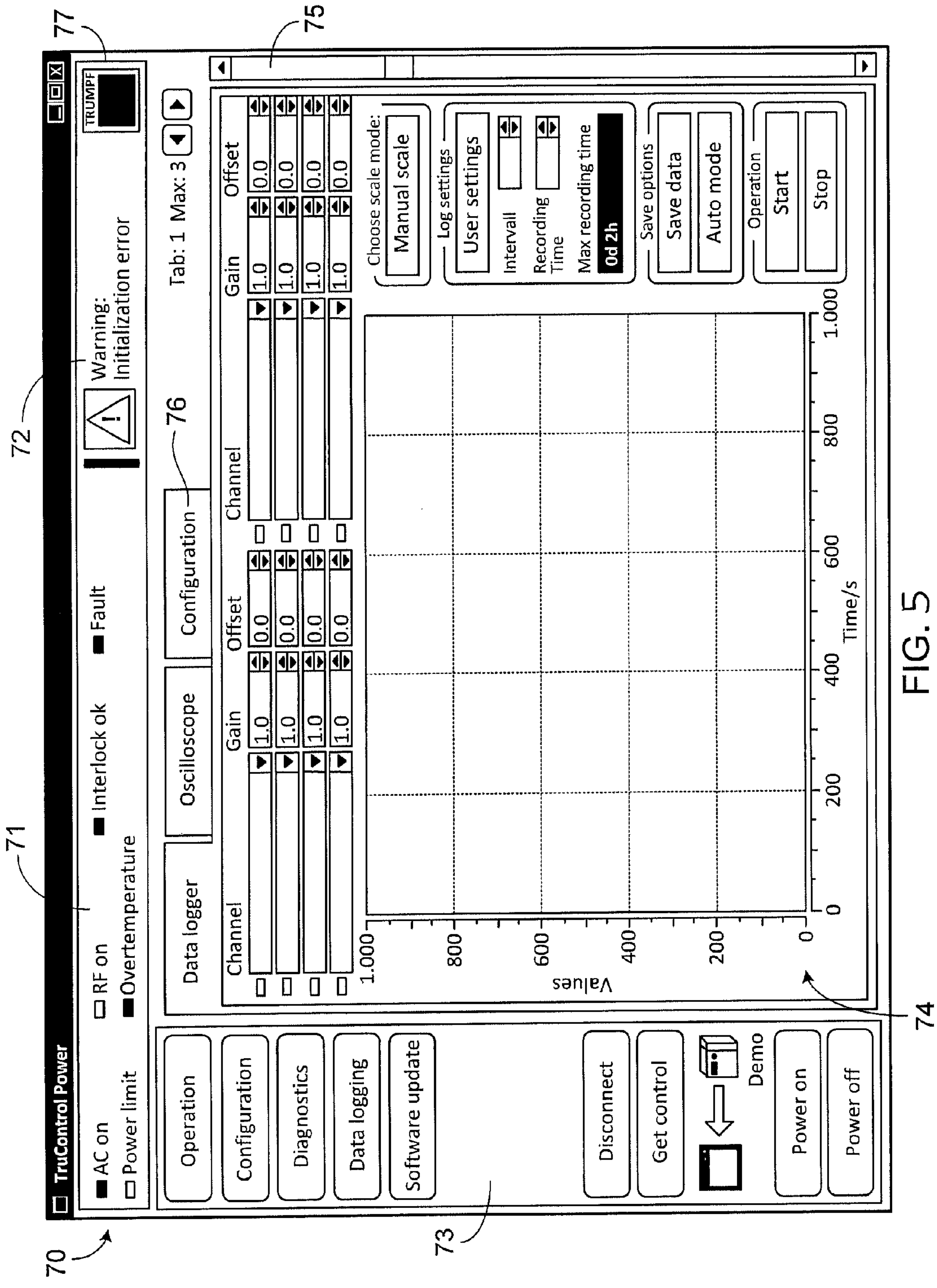
FIGS. 5 and 6 show screen shots taken from the graphic user interface of FIG. 4.
Figure 6:
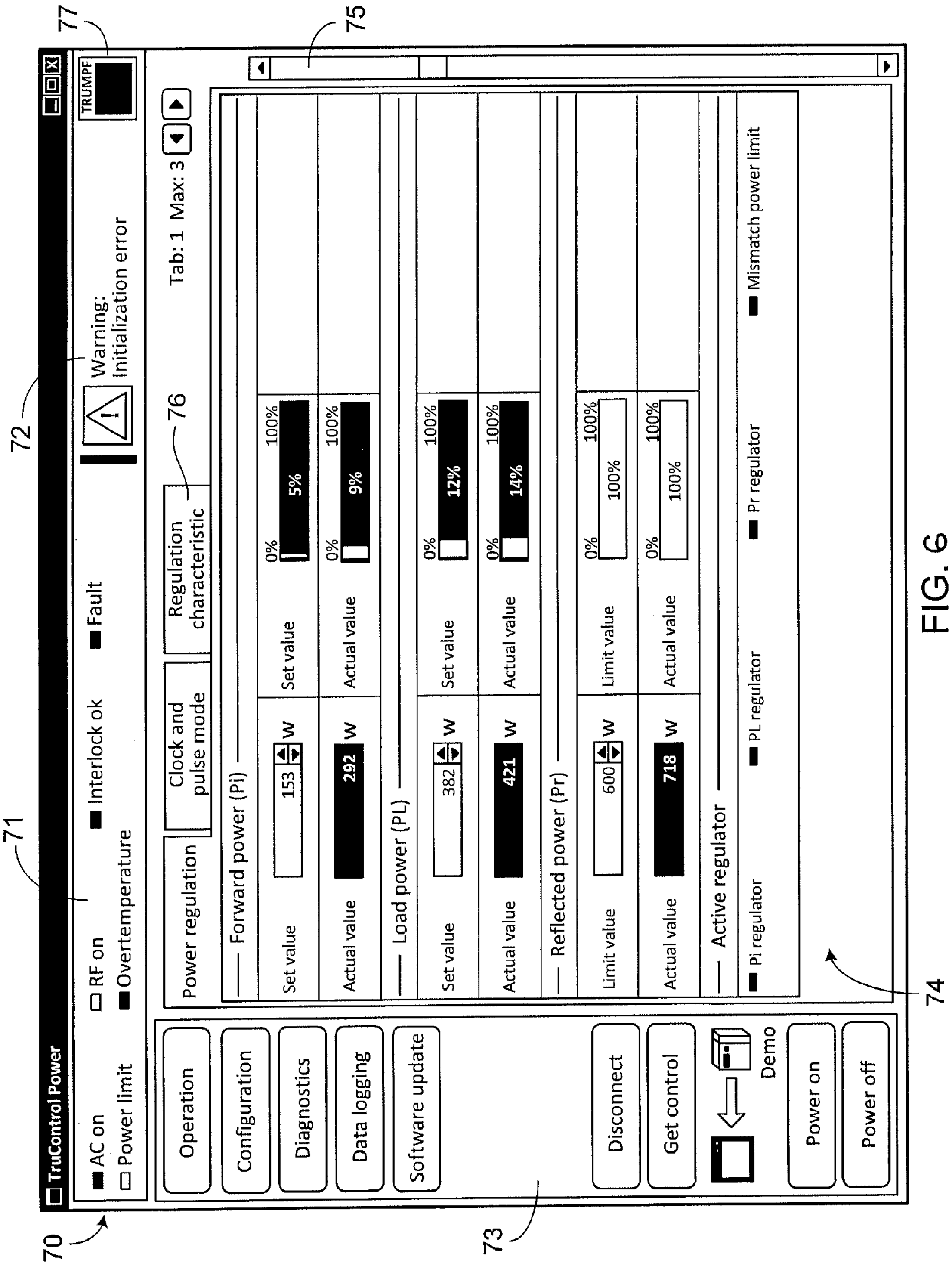

FIGS. 5 and 6 are screen shots of different examples of the graphic user interface 70. Control elements 73 are provided to control the different power generators 30 and controllable system component 60 using the graphic user interface 70. By selecting different control elements 73 (e.g., Operation, Configuration, Diagnostics, Data logging, and other elements), the dynamic region 74 can include different type of information that can be selected using multiple tabs 76. When the Data logging control element 73 is selected, as shown in FIG. 4, one set of tabs 76 (e.g., Data logger, Oscilloscope, and Configuration) can be displayed in the dynamic region 74. Similarly, when the Operation control element 73 is selected, as shown in FIG. 5, a different set of tabs 76 (e.g., Power regulation, Clock and pulse mode, and Regulation characteristic) can be displayed in the dynamic region 74.

Figure 7:
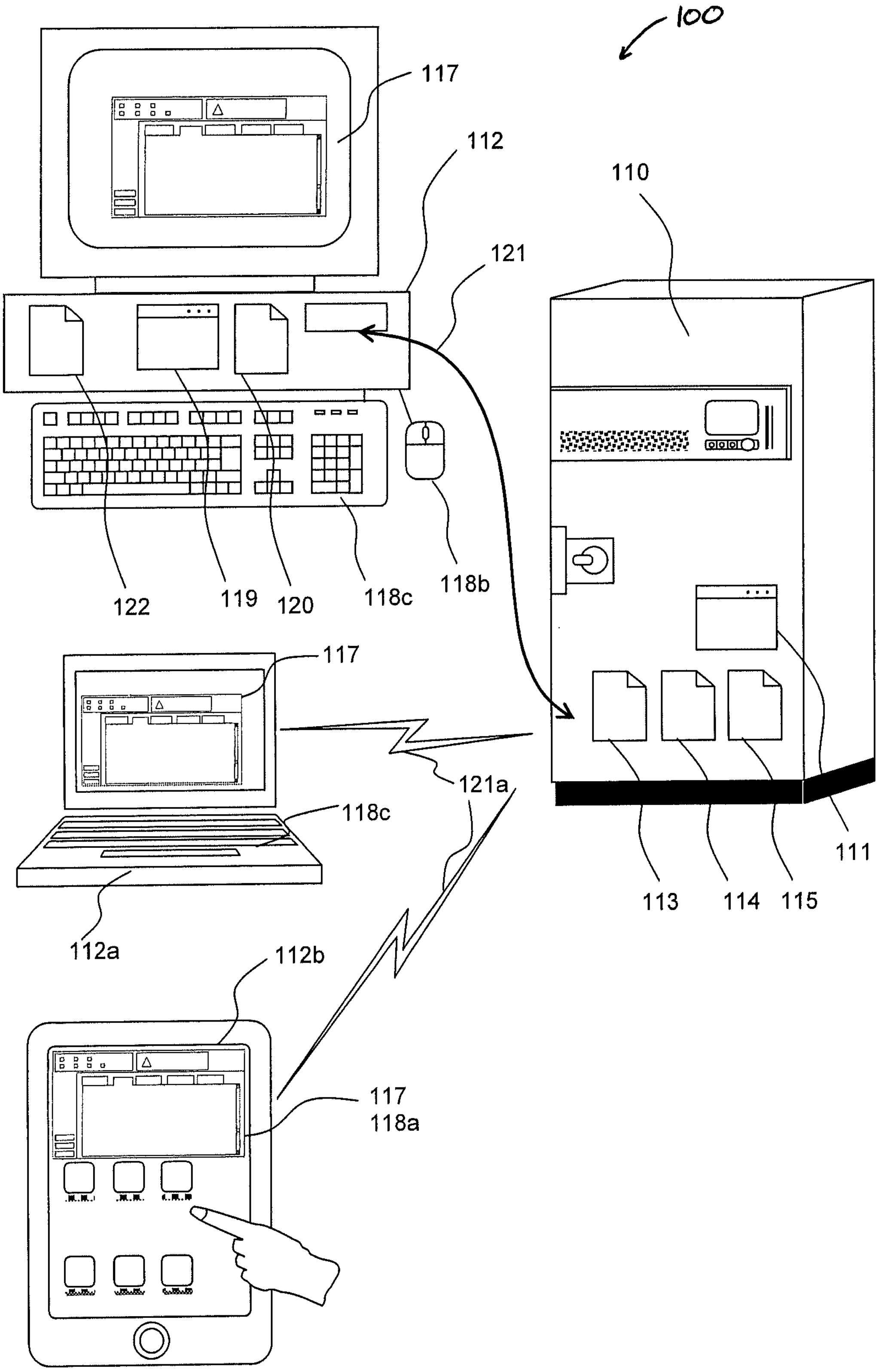
FIG. 7 is a schematic illustration of a power generator connected to multiple operating units.

FIG. 7 shows a power supply system 100 that includes an operating unit 112 and a power generator 110 of FIG. 2. The power generator 110 is shown with the reference numbers of FIG. 2. The power supply system 100 includes several operating units, for example, a personal computer 112, a laptop 112*a*, and a touchpad operating unit 112*b* (e.g., a smart phone, a tablet personal computer, or similar device). The operating units 112-112*b* can be used individually or together in a network. The operating units 112-112*b* can be connected to a power generator 110 by a wired data connection 121 or by a wireless data connection 121*a*.

Input devices of the respective operating units 112-112*b* can be a touchpad 118*a* in connection with the display device 117, a mouse 118*b*, a keyboard 118*c*, or a similar device. During setup and operation of the power supply system 100, the operating unit 12 imports an identifier 13 of the power generator 10.

Figure 8:
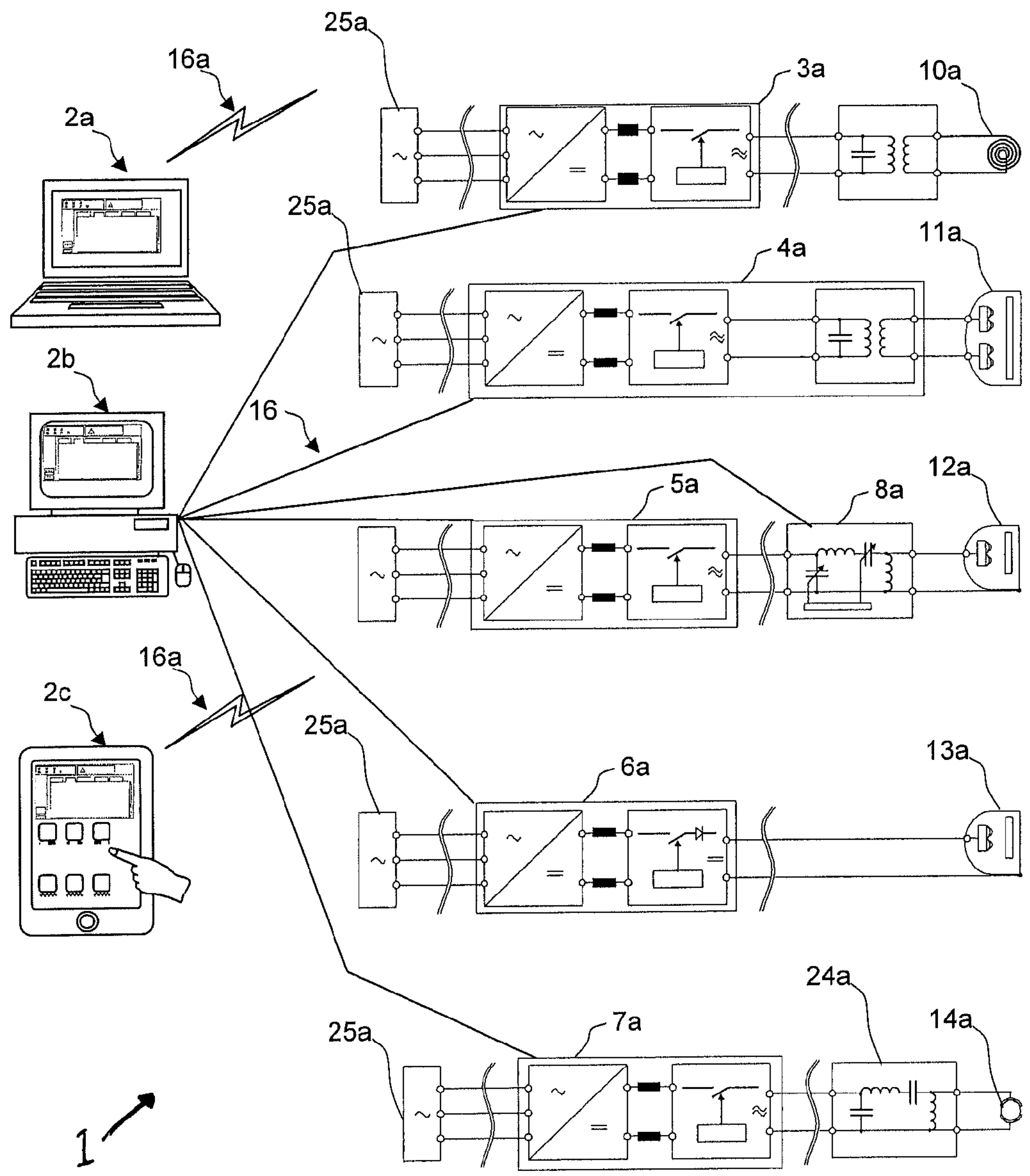
FIG. 8 is a schematic illustration multiple operating units connected to multiple processing systems.

FIG. 8 shows the system 1 for controlling multiple plasma and/or induction heating processing systems of FIG. 1 in greater detail. A generator 3*a* supplies power to a first medium or high frequency induction heating processing system 10*a*. A generator 4*a* supplies power to a medium frequency (MF) plasma processing system 11*a*. A generator 5*a* supplies power to a high frequency (HF) plasma processing system 12*a* via an impedance matching device 8*a*. The impedance matching device 8*a* can also be controlled from the system 1. A generator 6*a* supplies power to a DC plasma processing system 13*a*. A generator 7*a* supplies power to a HF plasma processing system (e.g., laser processing system) 14*a* via a impedance matching device 24*a* that is, for example, a device (e.g., a fix match box) with fixed inductivities and capacities. The power generators 3*a*-7*a* are connected to a power mains network 25*a*. The system 1 includes several operating units 2, for example, a personal computer 2*b*, a laptop 2*a*, and a touchpad operating unit 2*c* (e.g., a smart phone, a tablet personal computer, or similar device). The operating units 2-2*c* can be used individually or together in a network. The operating units 2-2*c* can be connected to the various generators 3*a*-7*a* by a wired data connection 16 or by a wireless data connection 16*a*.

A number of embodiments of the invention have been described. Nevertheless, it will be understood that various modifications may be made without departing from the spirit and scope of the invention. Accordingly, other embodiments are within the scope of the following claims.

What is claimed is:

1. A system for controlling a plurality of plasma and/or induction heating processing systems, the system comprising:

an operating unit comprising:

a display device on which a graphic user interface can be displayed, the graphic user interface having a static region and a dynamic region; and a selection device for selecting information to be displayed in the dynamic region;

at least two power generators, each for supplying power to a plasma processing system or an induction heating processing system; and a network that connects the operating unit to the power generators to transmit signals including control signals between the operating unit and the power generators during operation of the power generators.

2. The system according to claim 1, wherein the at least two power generators comprise at least two different types of power generators.

3. The system according to claim 1, wherein the static region comprises a display region for displaying warning or error messages from all connected power generators and system components.

4. The system according to claim 1, wherein the at least two power generators can be simultaneously controlled.

5. The system according to claim 1, wherein the static region comprises superordinate control elements.

6. The system according to claim 1, wherein the graphic user interface for the power generators comprises a static region and a dynamic region, and respective proportions of a surface-area of the graphic user interface that are associated with the dynamic region and the static region are substantially the same regardless of the number and type of connected power generators and system components.

7. The system according to claim 1, wherein the static region comprises control elements for changing between different dynamic regions.

8. The system according to claim 1, wherein the graphic user interface comprises a maximum of two regions.

9. The system according to claim 8, wherein the two regions comprise the static region and the dynamic region, and the static region and the dynamic region are always visible for a user while the system is on.

10. The system according to claim 1, wherein the operating unit comprises an input device for manipulating the graphic user interface.

11. The system according to claim 1, further comprising controllable system components that are connected to the operating unit via the network.

12. The system according to claim 1, wherein information relating to the power generators controlled by the operating unit, or warning messages and/or statuses relating to processing systems supplied by the power generators can be displayed on the display device.

13. The system according to claim 1, wherein the operating unit comprises an operating application that imports an identifier of the power generators connected thereto, and constructs the graphic user interface on the display device based on generator-specific configuration data stored for each power generator and the identifiers.

14. The system according to claim 13, wherein language data that can be processed by the operating application are stored in the operating unit.

15. The system according to claim 13, wherein templates generated in the operating application are stored in the operating unit.

16. The system according to claim 1, wherein configuration data of the power generators are stored in the power generator or in the operating unit.

17. The system according to claim 16, wherein the configuration data comprise generator-specific parameter data and/or visualization data.

18. The system according to claim 1, further comprising a plurality of operating units which substantially have the same graphic user interface.

19. The system according to claim 1, wherein the operating unit is connected to the power generators wirelessly.

* * * * *